US010325789B2

(12) United States Patent
Newman

(10) Patent No.: US 10,325,789 B2
(45) Date of Patent: Jun. 18, 2019

(54) HIGH PRODUCTIVITY SOAK ANNEAL SYSTEM

(71) Applicant: Applied Materials, Inc., Santa Clara, CA (US)

(72) Inventor: Jacob Newman, Palo Alto, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 287 days.

(21) Appl. No.: 15/355,763

(22) Filed: Nov. 18, 2016

(65) Prior Publication Data

US 2017/0213749 A1    Jul. 27, 2017

Related U.S. Application Data

(60) Provisional application No. 62/281,568, filed on Jan. 21, 2016.

(51) Int. Cl.
*H01L 21/67* (2006.01)
*H01L 21/687* (2006.01)
*H01L 21/677* (2006.01)

(52) U.S. Cl.
CPC .. *H01L 21/67109* (2013.01); *H01L 21/67115* (2013.01); *H01L 21/67196* (2013.01);
(Continued)

(58) Field of Classification Search
CPC ......... H01L 21/67109; H01L 21/67748; H01L 21/67115; H01L 21/68771;
(Continued)

(56) References Cited

U.S. PATENT DOCUMENTS

| 5,855,465 A | 1/1999 | Boitnott et al. |
| 6,234,788 B1 | 5/2001 | Lee |

(Continued)

FOREIGN PATENT DOCUMENTS

| JP | 2004128247 A | 4/2004 |
| JP | 2015-057861 A | 3/2015 |

(Continued)

OTHER PUBLICATIONS

International Search Report and Written Opinion of related application PCT/US2016/064457 dated Mar. 20, 2017.

*Primary Examiner* — Shawntina T Fuqua
(74) *Attorney, Agent, or Firm* — Patterson + Sheridan LLP

(57) ABSTRACT

Embodiments described herein relate to apparatus and methods for thermally processing substrates. In one embodiment, a processing system includes a factory interface coupled to a plurality of load lock chambers. The plurality of load lock chambers are coupled to a transfer chamber which houses a robot. A thermal processing chamber is coupled to the transfer chamber and the robot is configured to transfer substrate between the load lock chambers and the thermal processing chamber. A multi-substrate support, which is disposed within the thermal processing chamber, rotates to facilitate efficient substrate thermal processing. A gas curtain apparatus disposed in a port plenum provides environment separation between the processing chamber and the transfer chamber while enabling efficient substrate transfer between the thermal processing chamber and the transfer chamber.

20 Claims, 4 Drawing Sheets

(52) U.S. Cl.
CPC .. *H01L 21/67201* (2013.01); *H01L 21/67748* (2013.01); *H01L 21/68757* (2013.01); *H01L 21/68764* (2013.01); *H01L 21/68771* (2013.01); *H01L 21/68742* (2013.01)

(58) Field of Classification Search
CPC ......... H01L 21/67201; H01L 21/67196; H01L 21/68754; H01L 21/68764; H01L 21/68742; A61B 5/04021; G16H 50/50
See application file for complete search history.

(56) References Cited

U.S. PATENT DOCUMENTS

| | | |
|---|---|---|
| 6,727,474 B2 | 4/2004 | Gat |
| 8,814,489 B2 | 8/2014 | Sakaue et al. |
| 2006/0009047 A1 | 1/2006 | Wirth et al. |
| 2010/0055351 A1* | 3/2010 | Kato ................. C23C 16/45521 427/595 |
| 2012/0213613 A1 | 8/2012 | de Ridder |
| 2013/0153807 A1 | 6/2013 | Balasubramanyam et al. |
| 2013/0167936 A1 | 7/2013 | Kobayashi |
| 2014/0366953 A1 | 12/2014 | Lee et al. |

FOREIGN PATENT DOCUMENTS

| | | |
|---|---|---|
| KR | 10-2011-0129280 A | 12/2011 |
| WO | 2014143846 A1 | 9/2014 |

* cited by examiner

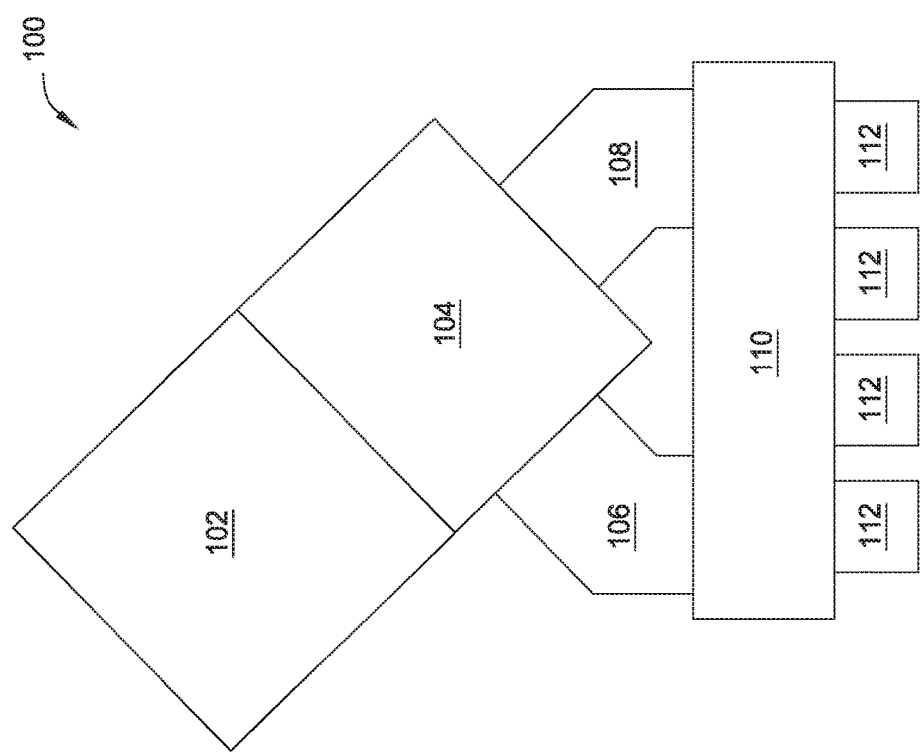

HIGH PRODUCTIVITY SOAK ANNEAL SYSTEM

CROSS-REFERENCE TO RELATED APPLICATIONS

This application claims benefit of U.S. Provisional Patent Application No. 62/281,568, filed Jan. 21, 2016, the entirety of which is herein incorporated by reference.

BACKGROUND

Field

Embodiments of the present disclosure generally relate to a thermal processing of substrates. More specifically, embodiments described herein relate to apparatus and methods for soak annealing.

Description of the Related Art

Heating apparatus are often used in the semiconductor industry for processing substrates. In general, there are typically two broad configurations of heating apparatus. The first is a batch system in which multiple substrates (e.g. 25-200 substrates) are loaded into a tubular furnace and slowly heated to a desired temperature. Batch systems can be considered temperature equilibrium devices in that the furnace walls are approximately at the same temperature as the heating elements and the substrates being heated. Batch systems are typically referred to as "hot wall" systems since the furnace walls are at an elevated temperature. The primary advantage of a batch system is the ability to process many substrates at the same time which results in a cost per substrate reduction. However, batch systems suffer from several disadvantages, one of which is the speed with which the substrate temperature can be elevated or lowered. The large thermal mass of a batch furnace prevents quick temperature changes and leads to relatively long process times, ranging from about 15 minutes to several hours or more.

A second configuration is rapid thermal processing (RTP) where a single substrate is heated in a small process volume using radiant energy as the energy source. For example, RTP systems typically include a substrate support for holding a substrate and a light source than emits light energy for heating the substrate. During heat treatment, the substrate is heated under controlled conditions according to a desired temperature regime.

RTP systems typically operate in a non-equilibrium state. The walls of the chamber are typically cooled with respect to the heated substrate and may be referred to as "cold wall" systems. An advantage of RTP systems is the ability to quickly change substrate temperature which enables short heating cycles which can be between one second and several minutes. However, one drawback of RTP systems is the cost per substrate processed, since the systems are equipped for processing a single substrate at a time.

Accordingly, there is a need in the art for improved substrate annealing apparatus.

SUMMARY

In one embodiment, a substrate processing apparatus is provided. The apparatus includes a thermal processing chamber which includes a rotatable substrate support sized to support a plurality of substrates thereon and a heat source disposed above or below the rotatable substrate support. A transfer chamber is coupled to the thermal processing chamber and a substrate transfer device is disposed within the transfer chamber. Plenum walls define a port plenum and extend from the thermal processing chamber into the transfer chamber and a purge device is coupled to the plenum walls within the port plenum. A first load lock chamber is coupled to the transfer chamber and a second load lock chamber is coupled to the transfer chamber. The first load lock chamber and the second load lock chamber are coupled to the transfer chamber opposite the thermal processing chamber.

In another embodiment, a substrate processing apparatus is provided. The substrate processing apparatus includes a thermal process chamber having a body defining a process volume and a gas distribution device disposed within the process volume. A rotatable substrate support is disposed within the process volume opposite the gas distribution device and the rotatable substrate support is sized to support a plurality of substrates thereon. A heat source is disposed in the process volume above or below the rotatable substrate support. A transfer chamber is coupled to the thermal process chamber and a substrate transfer device is disposed within the transfer chamber. Plenum walls define a port plenum extending from the thermal process chamber into the transfer chamber and a purge device is coupled to the plenum walls within the port plenum. A plurality of load lock chambers are coupled to the transfer chamber opposite the thermal process chamber.

In yet another embodiment, a substrate processing apparatus is provided. The substrate processing apparatus includes a thermal process chamber having a rotatable substrate support sized to support a plurality of substrates thereon and a heat source disposed above or below the rotatable substrate support. A transfer chamber is coupled to the thermal process chamber and a substrate transfer device is disposed within the process chamber. Plenum wall defining a port plenum extends from the thermal process chamber into the transfer chamber and a purge device is coupled to the plenum wall within the port plenum. A first load lock chamber is coupled to the transfer chamber and a second load lock chamber is coupled to the transfer chamber. The first load lock chamber and the second load lock chamber are coupled to the transfer chamber opposite the thermal process chamber and the first load lock chamber and the second load lock chamber are coupled to a factory interface opposite the transfer chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1 illustrates a schematic, plan view of a processing system according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figures 2A, 2B:
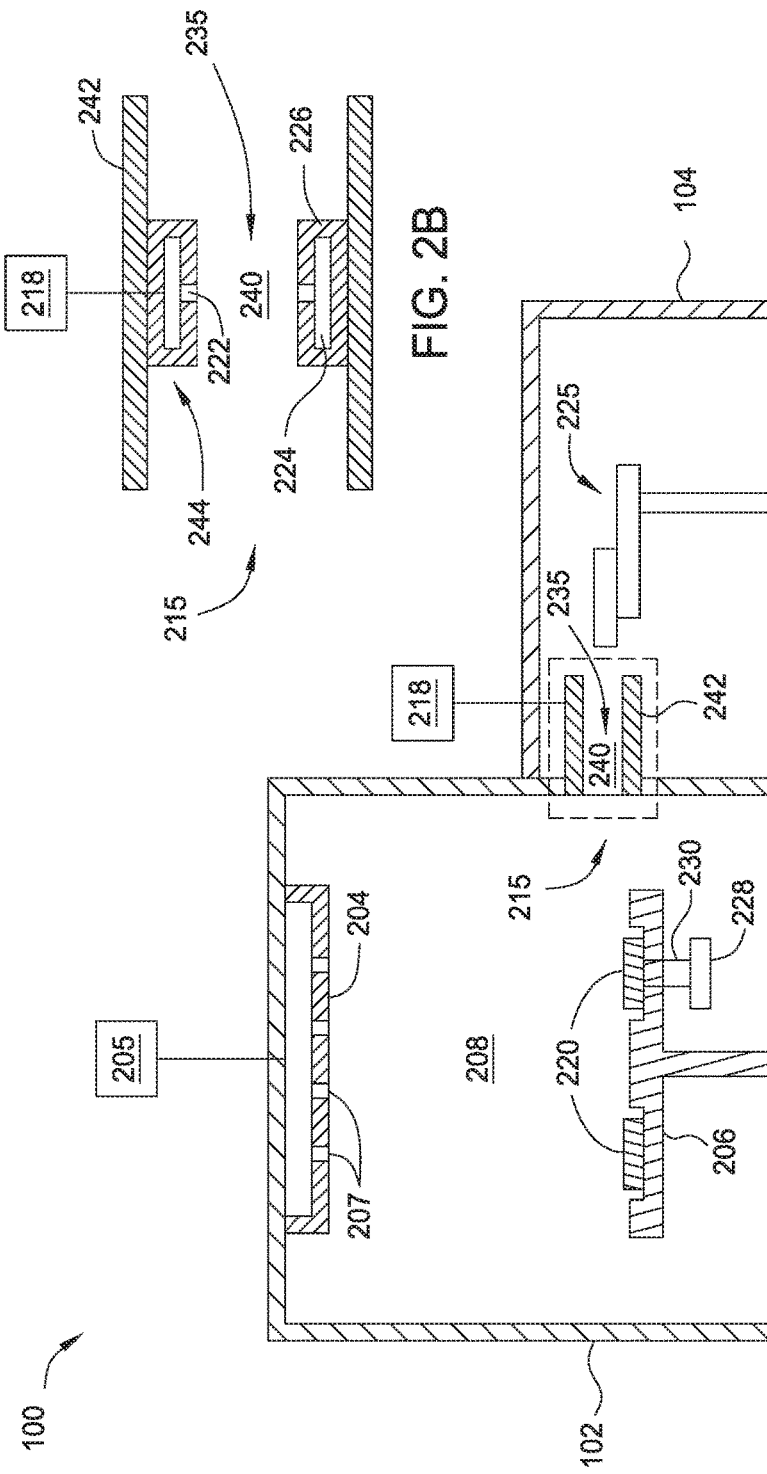
FIG. 2A illustrates a schematic, cross-sectional view of a portion of the processing system of FIG. 1 according to embodiments described herein.
FIG. 2B illustrates a schematic, cross-sectional detailed view of a port plenum according to embodiments described herein.

Embodiments described herein relate to apparatus and methods for thermally processing substrates. In one embodiment, a processing system includes a factory interface coupled to a plurality of load lock chambers. The plurality of load lock chambers are coupled to a transfer chamber which houses a robot. A thermal processing chamber is coupled to the transfer chamber and the robot is configured to transfer substrate between the load lock chambers and the thermal processing chamber. A multi-substrate support, which is disposed within the thermal processing chamber, rotates to facilitate efficient substrate thermal processing. A purging apparatus disposed in a port plenum provides environment separation between the processing chamber and the transfer chamber while enabling efficient substrate transfer between the thermal processing chamber and the transfer chamber.

FIG. 1 illustrates a schematic, plan view of a process system 100 according to embodiments described herein. The process system 100 includes a thermal process chamber 102 which is coupled to a transfer chamber 104. A plurality of load lock chambers, such as a first load lock chamber 106 and a second load lock chamber 108, are coupled to the transfer chamber opposite the thermal process chamber 102. The load lock chambers 106, 108 may be sized to accommodate between about 5 and about 25 substrates at any given time. Each of the load lock chambers 106, 108 are coupled to a factory interface 110.

One or more cassettes 112, which are generally configured to house processed and unprocessed substrates, may be removably coupled to the factory interface 110. The process system 100 may be designed to reduce the overall footprint of the process system 100 to improve efficient use of fab floor space. By utilizing multiple load lock chambers, efficiency may be increased because unprocessed substrates may be continually available in one load lock chamber while processed substrates are maintained in another load lock chamber, or vice versa.

The thermal process chamber 102 is configured to thermally process or anneal substrates for various applications, such as pre or post processing operations, dopant incorporation, and the like. The thermal processing chamber 102 is sized and configured to thermally process a plurality of substrates (e.g., 3 or more) at a single time while enabling efficient substrate exchange of processed and unprocessed substrates. The transfer chamber 104, which houses a robot, may be utilized to transfer processed and unprocessed substrates between the load lock chambers 106, 108 and the thermal process chamber 102. In one embodiment, the thermal processing chamber 102, the transfer chamber 104, and the load lock chambers 106, 108 may be maintained at substantially similar pressures, such as atmospheric or reduced pressures (e.g., vacuum environment), to enable efficient substrate transfer within the processing system 100.

FIG. 2A illustrates a schematic, cross-sectional view of a portion of the process system 100 of FIG. 1 according to embodiments described herein. The process system 100 includes the thermal processing chamber 102 coupled to the transfer chamber 104 via a port 215. The port 215 is sized to facilitate passage of substrates 220 therethrough by a substrate transfer device 225 (e.g. robot). The substrate transfer device 225 includes one or more transfer arms (e.g. blades) which operate in coordination with one another to facilitate efficient substrate transfer within the processing system 100. In one embodiment, the substrate transfer device has five arms. For example, the substrate transfer device 225 may include a first arm and a second arm. In one embodiment, the first arm operates to deliver or remove a substrate from the process volume 208 while the second arm retrieves or delivers a substrate to or from the load lock chambers 106, 108. Additional arms may also be synchronized with the first and second arms to facilitate substrate transfer between the process volume 208 and the load lock chambers 106, 108.

The thermal processing chamber 102 defines process volume 208. A gas distribution device 204 (e.g. showerhead) is disposed within the process volume 208 and may be coupled to a wall of the thermal processing chamber 102. One or more gas distribution ports 207 are formed in the gas distribution device 204 to allow the passage of gasses therethrough. The gas distribution device 204 may also be fluidly coupled to a process gas source 205. The process gas source 205 is configured to deliver one or more process gases to the process volume 208 through the gas distribution ports 207 of the gas distribution device 204. Suitable gases for thermally processing the substrates 220 include gases which do not substantially deposit on or etch the substrate 220 under the conditions maintained within the process volume 208. Examples of gases include inert gases (e.g. noble gases) or other gases which are substantially non-reactive under thermal processing conditions (e.g. $N_2$, $H_2$, etc.). A vacuum pump 240 may also be in fluid communication with the process volume 208 and may be configured to generate various degrees of vacuum therein, depending upon desired thermal processing conditions.

A substrate support 206 is also disposed within the process volume 208. The substrate support 206 may be manufactured from a material suitable for thermal processing, such as a ceramic material, for example, silicon carbide, or a graphite material. In one embodiment, the substrate support 206 is formed from graphite and coated with a silicon carbide material. The substrate support material may be selected to effectively operate in an environment having temperatures between about 200° C. and about 1100° C. Generally, the substrate support 206 is disposed opposite the gas distribution device 204. The substrate support 206 may include a plurality of wells, rings, or other substrate supporting apparatus to support the substrates 220 during thermal processing.

Lift pins 230 and a lift motor 228 may also be coupled to the substrate support 206 to facilitate positioning of the substrates 220 on and off of the substrate support 206. Generally, the lift pins 230 are actuated to a raised position when interfacing with the substrate transfer device 225 to load and unload substrates 220. The lift pins 230 are disposed in a lowered position with the substrates 220 supported by the substrate support 206 during thermal processing.

In one embodiment, a motor 203 is coupled to the substrate support 206. The motor 203 is configured to enable rotational movement of the substrate support 206. For example, the substrate support 206 may rotate in a carousel-like manner. In operation, the motor 203 rotates the substrate support 206 to a first position to receive a first substrate, rotates the substrate support 206 to a second position to receive a second substrate, and so on such that the substrates 220 are continually thermally processed during rotation of the substrate support 206.

The thermal processing of the substrates 220 continues until the substrates 220 are removed by the substrate transfer device 225. It is contemplated that the motor 203 may be synchronized with the substrate transfer device 225 to enable efficient and accurate loading and unloading of the substrate 220 from the substrate support 206. For example, the motor 203 may be configured to pause rotation for a period of time to allow for delivery or removal of a substrate 220 to and from the substrate support 206 by the substrate transfer device 225. In one embodiment, a substrate 220 disposed on the substrate support 206 makes a full rotation such that the substrate 220 is loaded and unloaded form the process volume 208 in the same position.

The port 215, which is disposed between the thermal process chamber 102 and the transfer chamber 104, includes an opening 235 which is aligned with the port 215. A gas source 218 is in fluid communication with the opening 235 which defines a port plenum 240. The port plenum 240 may be further defined by plenum walls 242 which extend from the thermal process chamber 102 adjacent the port 215.

FIG. 2B illustrates a detailed schematic, cross-sectional view of the port plenum 240 according to embodiments described herein. A purging device 244 is coupled to the plenum walls 242 such that the purging device 244 extends about an inner periphery of the port plenum 240. The purging device 244 includes a body 226 which defines a purge gas volume 224. The purge gas volume 224 is in fluid communication with the gas source 218 and gas from the gas source 218 is delivered to the port plenum 240 through a plurality of openings 222 formed in the body 226 of the purging device 244.

During operation of the thermal process chamber 102 and during substrate transfer to and from the transfer chamber 104, purge gas is flowed into the port plenum 240 to create a "gas curtain" that prevents or minimizes process gas from the process volume 208 from entering the transfer chamber 104. The gas source 218 may provide any suitable purge gas, such as argon, helium, nitrogen, or hydrogen. In one embodiment, the process gas source 205 and gas source 218 provides the same gas to the process volume 208 and the port plenum 240, respectively. In another embodiment, the process gas source 205 and the gas source 218 may provide different gases to the process volume 208 and the port plenum 240, respectively.

By utilizing the purging device 244, utilization of a slit valve door is avoided and more efficient substrate transfer may be achieved. For example, time associated with slit valve door opening and closing for transfer operations is eliminated. It is contemplated that a substrate may be transferred as quickly as every 12 seconds or faster depending upon the configuration of the substrate transfer device 225. Accordingly, if the substrate support 206 includes 5 substrate positions, a substrate may spend about 60 seconds being thermally processed before being removed from the thermal processing chamber 102. It is contemplated that if a greater amount of thermal processing time is desired, delays in substrate transfer may be employed to increase residence time of the substrate in the thermal processing chamber 102. In general, it is contemplated that substrate may be thermally processed for an amount of time equal to or greater than the substrate transfer device exchange time times the number of substrate positions on the substrate support 206.

Figure 3:
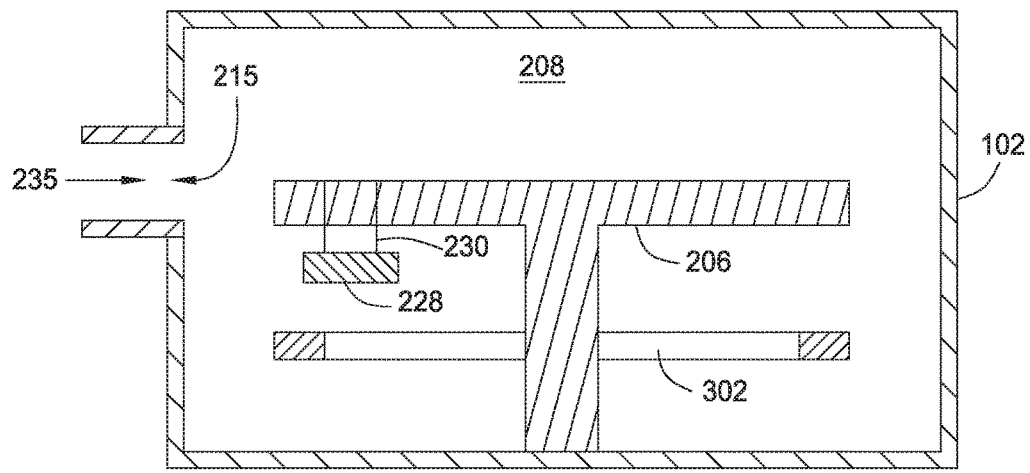
FIG. 3 illustrates a schematic, cross-sectional view of a thermal processing chamber according to embodiments described herein.

FIG. 3 illustrates a schematic, cross-sectional view of the thermal process chamber 102 according to embodiments described herein. In the illustrated embodiment, a heater 302 is disposed within the process volume 208 below the substrate support 206. In other words, the heater 302 may be positioned beneath the port 215, which is substantially coplanar with positions on the substrate support 206 which are occupied by substrates during thermal processing. The heater 302 may be a resistive heater, a graphite heater, or other type of electrically powered heater. The heater 302 may be ring shaped (as illustrated) or another suitable shape configured to provide a substantially even heating profile to substrates being thermally processed. The heater 302 may be configured to maintain a temperature in the processing volume 208 between about 200° C. and about 1100° C. A thickness of the substrate support 206 supporting the substrates may be selected such that a thermal mass of the substrate support 206 enables substantially constant heating of the substrates disposed on the substrate support 206. For example, the thermal mass of the substrate support 206 may facilitate maintenance of a substantially constant temperature across a diameter of the substrate support 206.

Alternative heating sources, such as lamps and the like, may also be utilized to heat the substrate support 206 and process volume 208. Similar to the heater 302, the alternative heating sources may be disposed below the substrate support 206. In embodiments utilizing lamps, a light transmissive material may be disposed between the lamps and the substrate support 206. For example, a quartz window may be disposed between the lamps and the substrate support 206.

Figure 4:
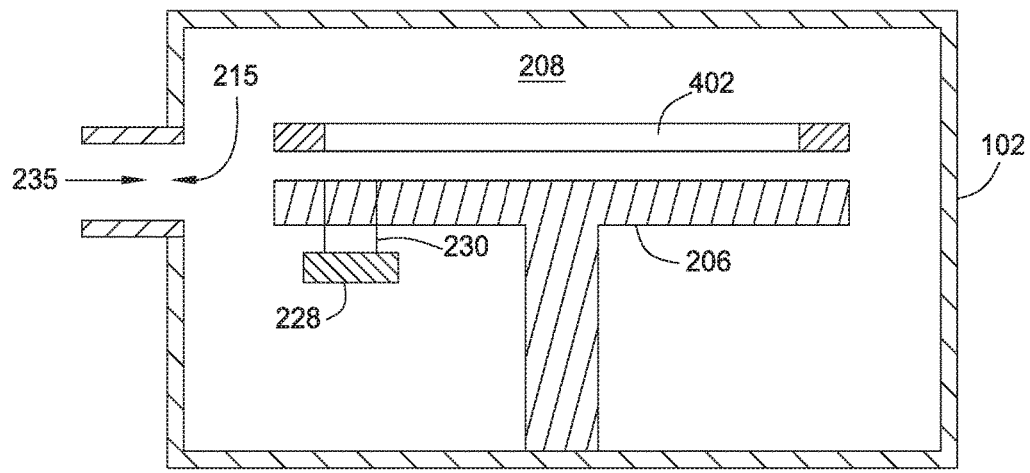
FIG. 4 illustrates a schematic, cross-sectional view of a thermal processing chamber according to embodiments described herein.

FIG. 4 illustrates a schematic, cross-sectional view of a thermal process chamber 102 according to embodiments described herein. In the illustrated embodiment, a heater 402 is disposed within the process volume 208 above the substrate support 206. In other words, the heater 402 may be positioned above the port 215, which is substantially coplanar with positions on the substrate support 206 which are occupied by substrates during thermal processing. Similar to the heater 302, the heater 402 may be a resistive heater, a graphite heater, or other type of electrically powered heater. The heater 402 may be ring shaped (as illustrated) or another suitable shape configured to provide a substantially even heating profile to substrates being thermally processed. The heater 402 may be configured to maintain a temperature in the process volume 208 between about 200° C. and about 1100° C. A thickness of the substrate support 206 supporting the substrates may be selected such that a thermal mass of the substrate support 206 enables substantially constant heating of the substrates disposed on the substrate support 206.

Alternative heating sources, such as lamps and the like, may also be utilized to heat the substrate support 206 and processing volume 208. Similar to the heater 402, the alternative heating sources may be disposed above the substrate support 206. In embodiments utilizing lamps, a light transmissive material may be disposed between the lamps and the substrate support 206. For example, a quartz window may be disposed between the lamps and the substrate support 206.

Figure 5:
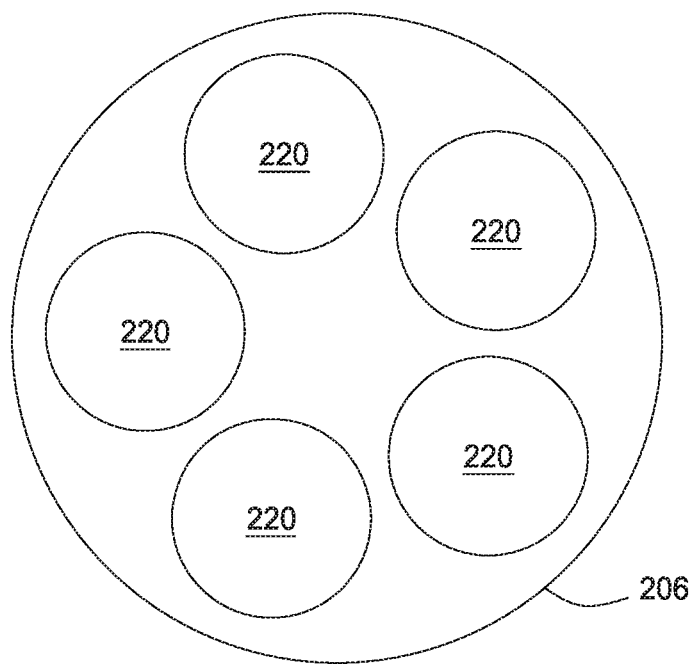
FIG. 5 illustrates a schematic, plan view of a substrate support according to embodiments described herein.

FIG. 5 illustrates a schematic, plan view of the substrate support 206 according to embodiments described herein. As previously described, the substrate support 206 is configured to support a plurality of substrates 220 during thermal processing. Although the illustrated embodiment depicts the substrate support 206 configured for five substrates, it is contemplated that a greater or lesser number of substrates may be supported by the substrate support 206. In one embodiment, the substrate support 206 is configured to support a plurality of 300 mm diameter substrates. Other substrate diameters, such as 200 mm or 450 mm, may also be supported by a substrate support sized to accommodate substrate sizes other than 300 mm substrates.

In summation, a thermal batch process chamber is provided that utilizes a rotatable substrate support for processing a plurality of substrates. Multiple load lock chambers, in combination with the substrate transfer apparatus in the transfer chamber, enable high throughput thermal processing capable of economically processing high volumes of substrates while maintaining advantages commonly associated with single substrate processing chambers. For example, the temperatures of the thermal processing chamber may be more quickly changed and/or maintained while the advantages of higher throughput are also realized utilizing the embodiments described herein.

While the foregoing is directed to embodiments of the present disclosure, other and further embodiments of the disclosure may be devised without departing from the basic scope thereof, and the scope thereof is determined by the claims that follow.

What is claimed is:

1. A substrate processing apparatus, comprising:
   a thermal process chamber, comprising:
      a rotatable substrate support sized to support a plurality of substrates thereon; and
      a heat source disposed above or below the rotatable substrate support;
   a transfer chamber coupled to the thermal process chamber, wherein a substrate transfer device is disposed within the transfer chamber;
   plenum walls defining a port plenum extending from the thermal process chamber into the transfer chamber, wherein a purge device is coupled to the plenum walls within the port plenum;
   a first load lock chamber coupled to the transfer chamber; and
   a second load lock chamber coupled to the transfer chamber, wherein the first load lock chamber and the second load lock chamber are coupled to the transfer chamber opposite the thermal process chamber.

2. The apparatus of claim 1, wherein the rotatable substrate support is sized to accommodate five 300 mm substrates.

3. The apparatus of claim 1, wherein the rotatable substrate support is formed from silicon carbide coated graphite.

4. The apparatus of claim 1, wherein the heat source is a resistive heater.

5. The apparatus of claim 4, wherein the resistive heater is ring shaped.

6. The apparatus of claim 1, wherein the heat source is a graphite heater.

7. The apparatus of claim 1, wherein the purge device extends about an inner periphery of the port plenum.

8. The apparatus of claim 1, wherein the purge device has a body defining a volume therein.

9. The apparatus of claim 8, wherein a plurality of openings are formed in the body of the purge device to fluidly couple the volume with the port plenum.

10. The apparatus of claim 9, wherein the volume is fluidly coupled to a purge gas source.

11. The apparatus of claim 1, wherein the first load lock chamber and the second load lock chamber are each sized to accommodate between 5 and 25 substrates.

12. A substrate processing apparatus, comprising:
    a thermal process chamber, comprising:
       a body defining a process volume;
       a gas distribution device disposed within the process volume;
       a rotatable substrate support disposed within the process volume opposite the gas distribution device, the rotatable substrate support sized to support a plurality of substrates thereon; and
       a heat source disposed in the process volume above or below the rotatable substrate support;
    a transfer chamber coupled to the thermal process chamber, wherein a substrate transfer device is disposed within the transfer chamber;
    plenum walls defining a port plenum extending from the thermal process chamber into the transfer chamber, wherein a purge device is coupled to the plenum walls within the port plenum; and
    a plurality of load lock chambers coupled to the transfer chamber opposite the thermal process chamber.

13. The apparatus of claim 12, further comprising a process gas source coupled to the thermal process chamber and in fluid communication with the process volume via the gas distribution device.

14. The apparatus of claim 13, wherein the process gas source delivers an inert gas to the process volume.

15. The apparatus of claim 13, further comprising a purge gas source in fluid communication with the port plenum.

16. The apparatus of claim 15, wherein the process gas source and the purge gas source deliver the same gas to the process volume and the port plenum, respectively.

17. The apparatus of claim 16, wherein the purge device has a body defining a volume therein and the purge gas source is in fluid communication with the volume.

18. The apparatus of claim 17, wherein the volume is in fluid communication with the port plenum via openings formed in the body of the purge gas device.

19. The apparatus of claim 18, wherein the purge gas device extends about an inner periphery of the port plenum.

20. A substrate processing apparatus, comprising:
    a thermal process chamber, comprising:
       a rotatable substrate support sized to support a plurality of substrates thereon; and
       a heat source disposed above or below the rotatable substrate support;
    a transfer chamber coupled to the thermal process chamber, wherein a substrate transfer device is disposed within the transfer chamber;
    plenum walls defining a port plenum extending from the thermal process chamber into the transfer chamber, wherein a purge device is coupled to the plenum walls within the port plenum;
    a first load lock chamber coupled to the transfer chamber;
    a second load lock chamber coupled to the transfer chamber, wherein the first load lock chamber and the second load lock chamber are coupled to the transfer chamber opposite the thermal process chamber; and
    a factory interface, wherein the first load lock chamber and the second load lock chamber are coupled to the factory interface opposite the transfer chamber.

\* \* \* \* \*